(12) United States Patent
Heald et al.

(10) Patent No.: US 6,448,805 B1
(45) Date of Patent: Sep. 10, 2002

(54) METHOD AND APPARATUS FOR WAFER-LEVEL TESTING OF SEMICONDUCTOR LASERS

(75) Inventors: David Leslie Heald, Solvang; Legardo Tardeo Reyes, Pacifica, both of CA (US)

(73) Assignee: Novalux, Inc., Sunnyvale, CA (US)

( * ) Notice: Subject to any disclaimer, the term of this patent is extended or adjusted under 35 U.S.C. 154(b) by 38 days.

(21) Appl. No.: 09/782,092

(22) Filed: Feb. 12, 2001

(51) Int. Cl.[7] .............................. G01R 31/26; H01S 5/00
(52) U.S. Cl. .................... 324/767; 324/765; 438/16; 438/17; 372/43; 372/50
(58) Field of Search ............................. 372/43, 50, 45, 372/46; 257/85; 438/16, 17; 324/765, 760, 767

(56) References Cited

U.S. PATENT DOCUMENTS 4,489,477 A * 12/1984 Chik et al. .................. 438/17
5,498,973 A * 3/1996 Cavaliere et al. ........... 324/765
6,265,237 B1 * 7/2001 Heffner et al. ............... 438/24

FOREIGN PATENT DOCUMENTS

DE 3916924 C1 * 5/1990 ................. 324/767

OTHER PUBLICATIONS

IBM Tech. Disclosure Bulletin, "Full–Wafer Testing of Laser Diodes" (NB8911368, Nov. 1, 1989).*

* cited by examiner

Primary Examiner—Michael Sherry
Assistant Examiner—Paresh Patel
(74) Attorney, Agent, or Firm—Fay Kaplun & Marcin, LLP

(57) ABSTRACT

A method and device for wafer level testing of semiconductor lasers allows probing from one side while detecting light output from the opposite side. A chuck with a transparent substrate receives the optical aperture side of a wafer of semiconductor lasers. The wafer is probed form the side opposite the side contacting the chuck and emitted light is detected on a side of the chuck opposite the side contacting the wafer.

19 Claims, 9 Drawing Sheets

METHOD AND APPARATUS FOR WAFER-LEVEL TESTING OF SEMICONDUCTOR LASERS

FIELD OF THE INVENTION

The present invention relates to methods and apparatus for testing semiconductor lasers and, more specifically relates to methods and apparatus for wafer-level testing of vertical cavity surface emitting lasers (VCSELs).

BACKGROUND OF THE INVENTION

Semiconductor lasers in use today include edge-emitting diode lasers and vertical cavity surface emitting lasers ("VCSELs"). In an edge-emitting laser, a semiconductor gain medium, for example, a quantum-well semiconductor structure, is formed on a surface of a semiconductor substrate. Once a device is detached from a wafer, cavity mirrors are formed or otherwise positioned on opposite ends of the gain medium, perpendicular to the substrate surfaces, to form a resonant cavity within which the gain medium is located. Electrical or optical pumping of the gain medium generates a laser beam which propagates in a direction along the plane of the substrate. As edge-emitting lasers generate a beam in a direction along the plane of a substrate forming the laser, these lasers can not be meaningfully tested in wafer form - that is, it is not practical to test these lasers prior to their being cleaved into individual units exposing the edges from which their beams are output.

VCSELs in contrast, propagate output beams in a direction perpendicular to the plane of a substrate on which they are formed. Thus the orientation of VCSELs on a wafer substrate prior to their being separated from one another is potentially suitable for testing. Prior wafer probe methods used on VCSELs involve electrically probing the optical aperture side of a wafer and detecting light emitted from that side while shorting the opposite side of the wafer to ground. Depending on the resistance profile of the wafer, this method may stimulate emissions from a single VCSEL, or emission from other VCSELs adjacent to and even substantially separated from the VCSEL to be probed due to the low electrical resistance between adjacent ones of the VCSEL array on the probed side.

SUMMARY OF THE INVENTION

The present invention is directed to a method for wafer level testing of semiconductor lasers comprising the steps of positioning a wafer on a chuck with a first side of the wafer contacting the chuck including optical apertures through which output beams of the lasers included therein are emitted and electrically probing individual ones of the lasers on a second side of the wafer to stimulate emission from the accessed lasers in combination with the step of detecting light from the accessed lasers after the light has passed through the chuck.

The present invention is further directed to a device for wafer level testing of semiconductor lasers comprising a chuck on which a wafer including lasers to be tested is received, wherein a first side of the wafer contacting the chuck includes optical apertures through which output beams of the lasers included therein are emitted and an electrical probe accessing individual ones of the lasers on a second side of the wafer to stimulate emission from the accessed lasers in combination with a light detector receiving light from the accessed lasers after the light has passed through the chuck.

DETAILED DESCRIPTION

Figure 1:
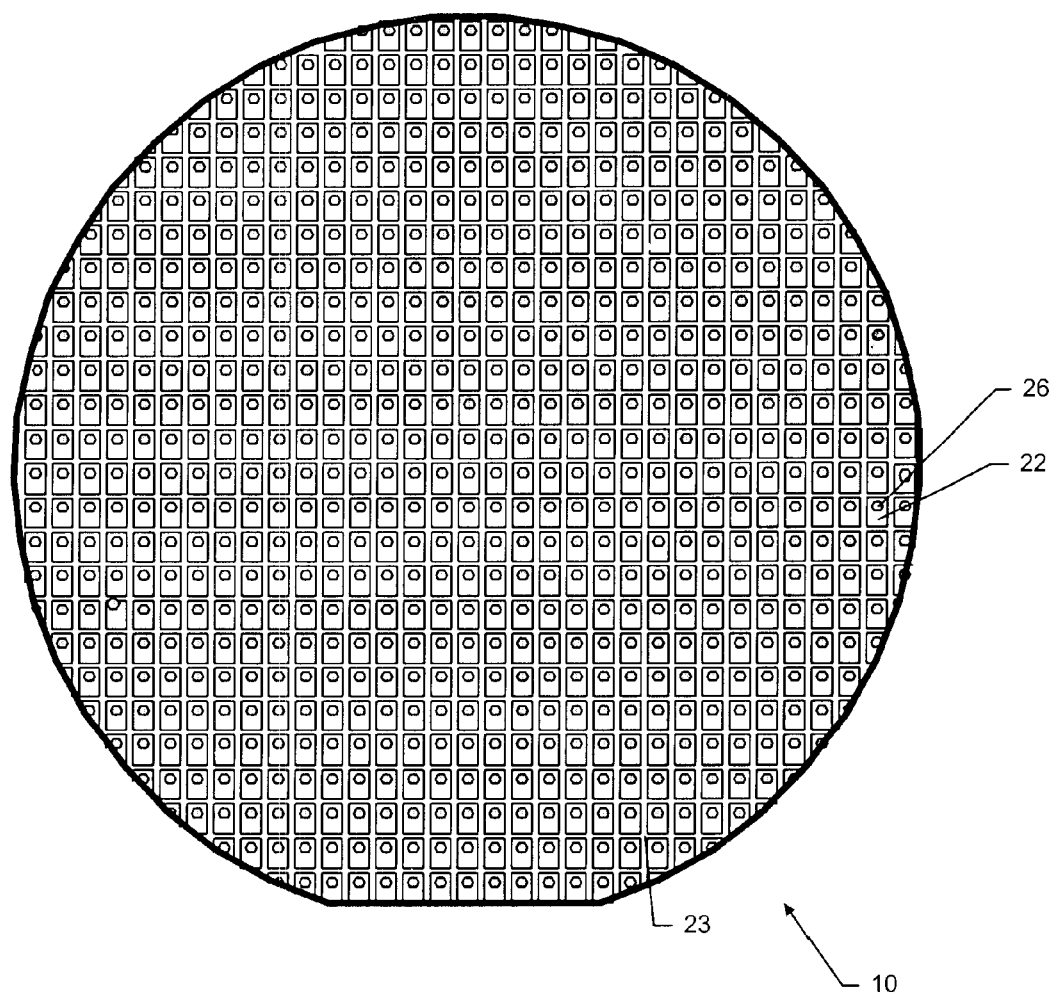
FIG. 1 shows a bottom view of a wafer configured for testing in accord with the apparatus and method according to the present invention.
Figure 2:
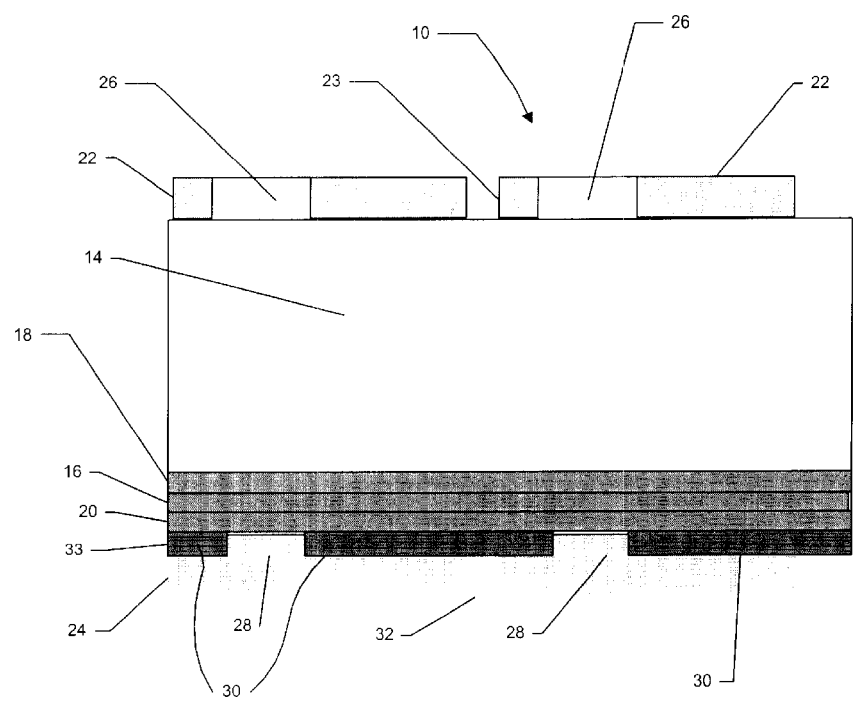
FIG. 2, shows a side view of a portion of the wafer of FIG. 1.
Figure 3:
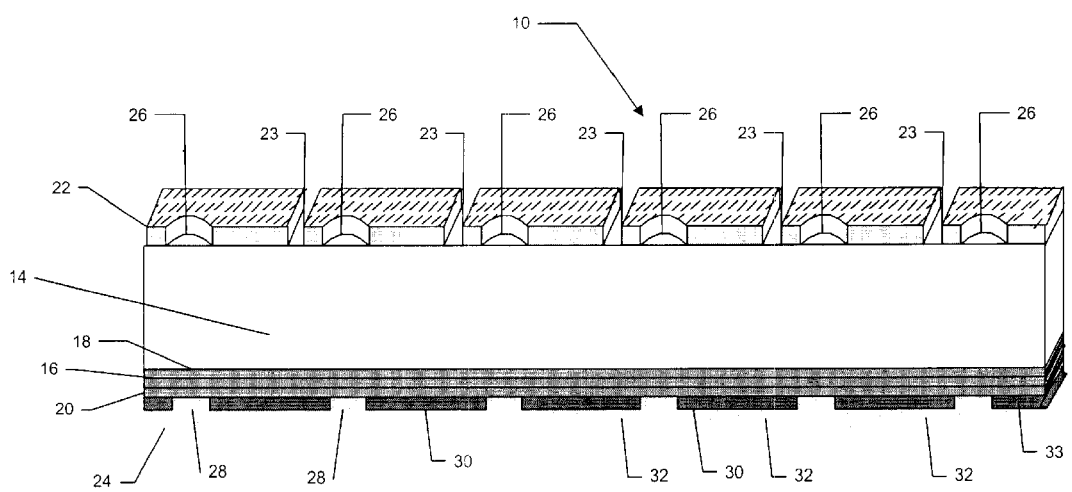
FIG. 3 shows a perspective view of a portion of the wafer of FIG. 1.
Figure 4:
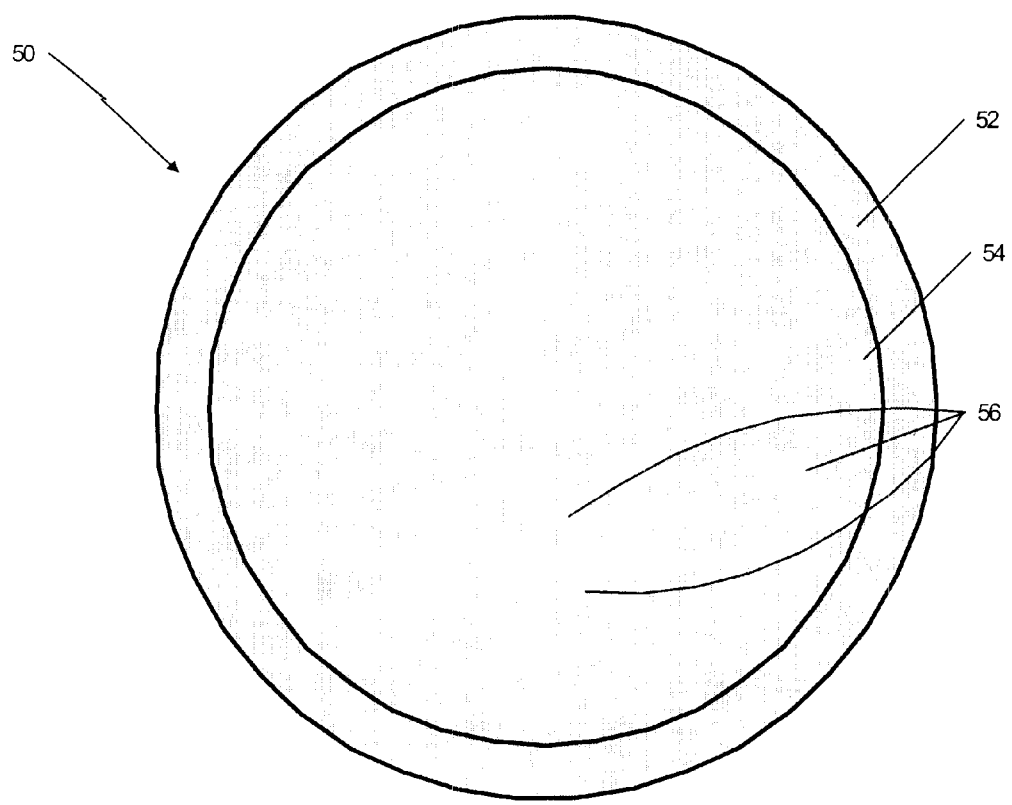
FIG. 4 shows a chuck for use with an apparatus for wafer-level testing of semiconductor lasers according to a first embodiment of the invention.
Figure 5:
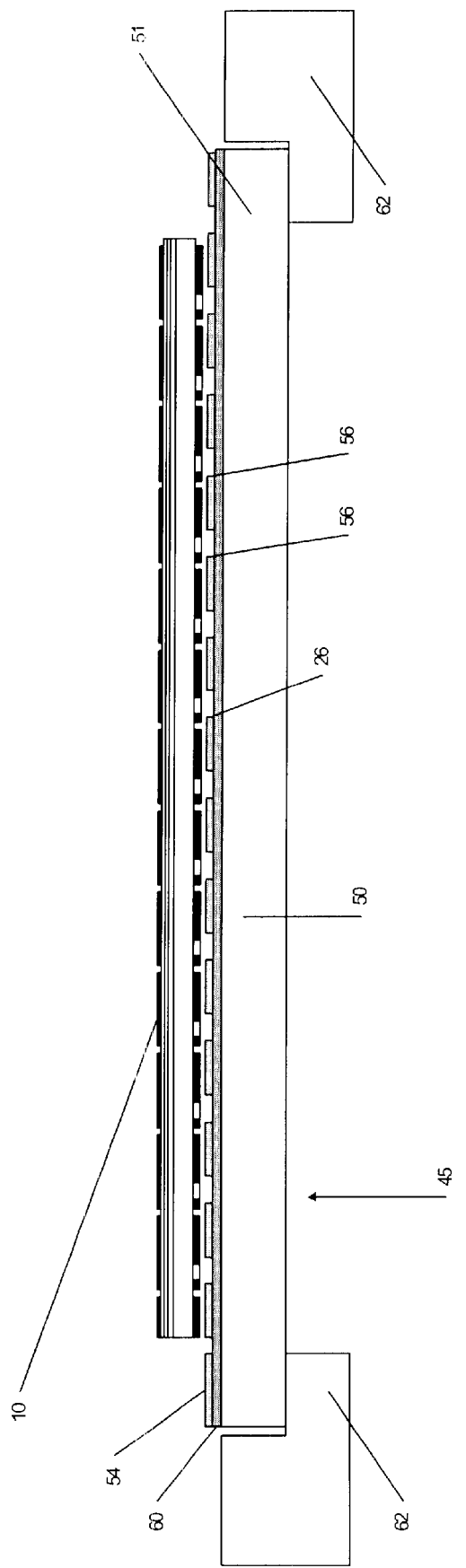
FIG. 5 shows a side view of an apparatus for wafer-level testing of semiconductor lasers according to the first embodiment of the invention.
Figure 6:
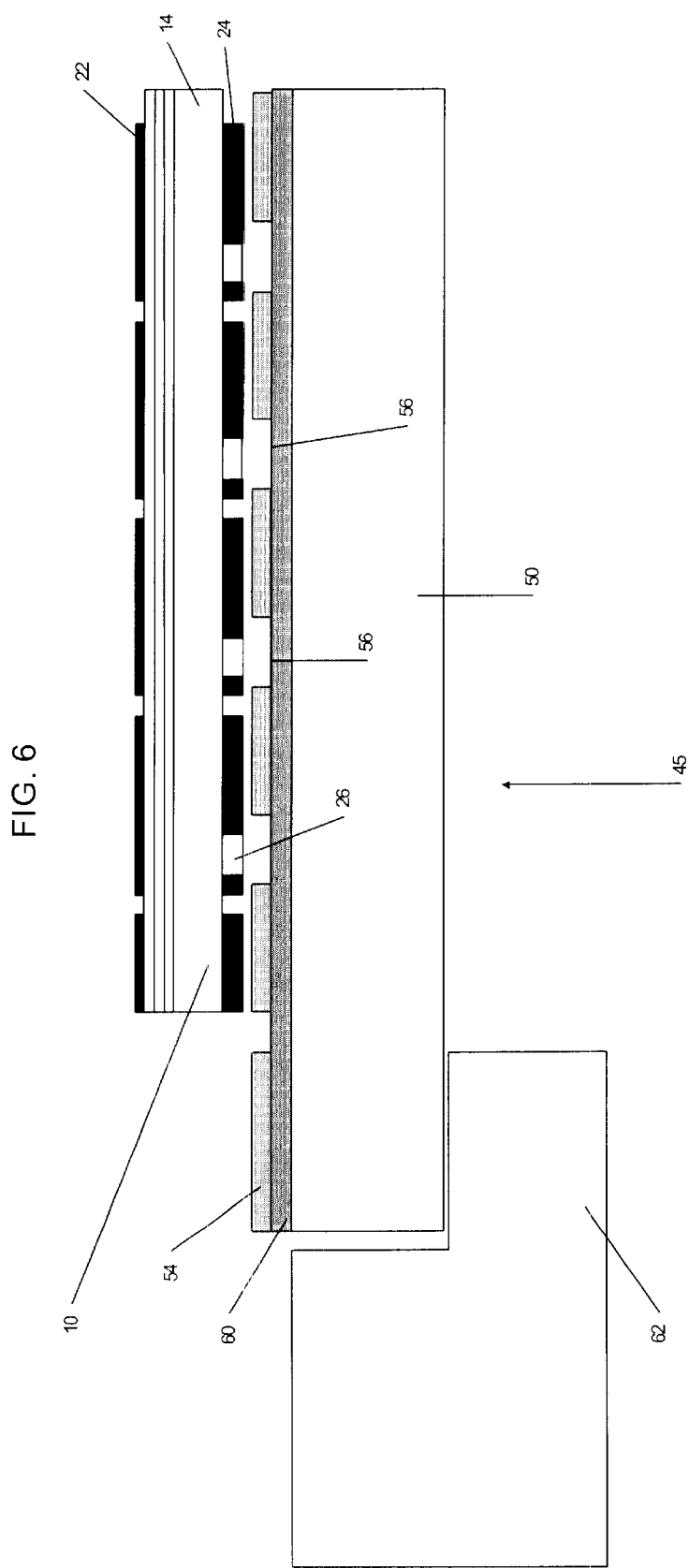
FIG. 6 shows an enlarged side view of a portion of the apparatus of FIG. 5 at the left side of FIG. 5.

FIGS. 1–3 show a wafer 10 suitable for testing in accord with the apparatus and method of the present invention. Specifically, the wafer includes a plurality of vertical cavity surface emitting lasers (VCSELs) 12 formed thereon. As shown in FIG. 2, this wafer 10 will typically include a substrate 14 with a gain region 16 formed thereon between first and second reflectors 18, 20, respectively. The VCSELs 12 include first electrodes 22 mounted on a first side thereof with second electrodes 24 mounted on a second side thereof. Each first electrode 22 includes an optical aperture 26 extending therethrough with each of the optical apertures 26 being aligned with a fundamental cavity mode of a corresponding one of the VCSELs 12. Furthermore, the first electrodes 22 are separated from one another by a series of channels 23 so that each first electrode corresponds to a respective one of the VCSELs 12. An insulating material 30 (e.g., SiN) may be deposited and patterned (e.g., with a photolithography/etching process) to define a contact region 28 at which each second electrode 24 will contact a corresponding VCSEL 12. A conducting material may then be deposited or otherwise mounted in electrical contact with the region defined by the insulating material 30. The conducting material may be patterned, for example, using a photolithography/etching process to electrically separate the individual contact regions by forming a plurality of gaps 32 therebetween. The plurality of gaps 32 are formed between the second electrodes 24 with each of the gaps 32 extending through the layer of second electrodes 24 to the insulating material 30 in a corresponding recess thereby electrically isolating each of the VCSELs 12 from one another on this side of the wafer 10. Of course those skilled in the art will recognize that the specific configuration of the VCSELs 12 on the wafer 10 and the arrangement of the various components of the VCSELs 12 on the substrate 14 may be altered in any desired manner without departing from the scope of the present invention.

Although the method and apparatus of the present invention will be useful with wafers 10 including a wide variety of arrangements of lasers formed thereon, in an exemplary embodiment of this invention, an electrical resistance on an optical aperture side of the wafer 10 (the top in FIG. 2) between the VCSELs 12 is low relative to that on the opposite side of the wafer 10. In this wafer 10, the electrical contacts 22 of the VCSELs 12 may be quite close together (e.g., separated by $\geq 100\mu$) so that lateral current leakage (i.e., current flow through the substrate 14) is more common. As will be understood by those skilled in the art, using the low resistance on the side of the optical apertures 26 allows all of the VCSELs 12 to be shorted out at once. The electrical contacts 24 opposite side of the wafer 10 are smaller and, therefore, further apart from one another. Furthermore, the electrical contacts 24 include the insulating material 30 therebetween. Thus, the electrical resistance between contacts 24 may be on the order of 100 ohms and any minimal current which may travel between VCSELs 12 probed on this side of the wafer 10 will be insufficient to cause the un-probed VCSELs 12 to emit light.

As seen in FIGS. 4–8, an apparatus 45 for wafer level testing of semiconductor lasers includes a chuck 50 having a rim 52 surrounding a metal film layer 54 which corresponds roughly to the surface area of the wafer 10. The metal film layer 54 includes a series of holes 56 extending therethrough so that, when the wafer 10 is placed on the chuck 50 in a predetermined testing alignment, each of the holes 56 is substantially aligned with a corresponding one of the optical apertures 26. As seen more clearly in FIGS. 5 and 6, the chuck 50 may be formed from an optically transparent substrate 50 on a flat surface of which a partially reflective coating 60 may be formed. The reflective layer 60 may, for example, be of the type available from CVI Laser Corp., Albuquerque, N. Mex. with a reflectivity of, for example, 70% to 90%. The metal film layer 54 is formed over the partially reflective coating 60 so that, in the view of FIG. 4, each of the holes 56 exposes a portion of the reflective coating 60. As the wafer 10 shown in FIG. 1 is substantially circular, the chuck 50 is also shown in such a shape. However, those skilled in the art will understand that the shape of the wafer 10 and the chuck 50 may be varied in any manner so long as the optical apertures 26 substantially align with the corresponding holes 56.

The chuck 50 may be composed of a substrate 51 formed, for example, of fused silica, sapphire, or any other material which is substantially transparent at the wavelength of an output beam of the VCSFLs 12 (e.g., 980 nm). The metal film layer 54 is preferably made of a material having low electrical resistance to minimize a voltage drop from a periphery of the chuck 50 at which voltage is applied to the center thereof and may consist of a plurality of sub-layers. For example, the metal film layer 54 may be formed of Ti, Au ($1.5\mu$ microns), Pt (100 A) film may be used to achieve a suitably low resistance. F or example, the metal film layer 54 may be comprised of a first layer of TI approximately 200 angstroms thick adjacent to the substrate 51, a second layer of Au approximately $1.5\mu$ microns thick and an outer scratch resistant layer formed of Pt approximately 100 angstroms thick. The holes 56 may then be formed, for example, using a photolithograpy/etching process or a lift off process.

The apparatus 45 may further include a "C" clamp 62 which, in a testing configuration, grips the chuck 50 and holds the chuck 50 in a predetermined position. When in the testing configuration, the wafer 10 is held in position on the chuck 50 with each of the optical apertures 26 in substantial alignment with a corresponding one of the holes 56 and with a plane in which the partially reflective coating 60 is formed extending substantially perpendicular to a fundamental cavity mode of each one of the VCSELs 12. This is preferably accomplished by forming an outer surface of the first electrode 22 as a portion of a plane extending substantially perpendicular to the fundamental cavity mode of each of the VCSELs 12 of the wafer 10 and then forming an outer surface of the metal film layer 54 as a portion of a plane substantially parallel to a surface of the partially reflective coating 60 so that, when the wafer 10 is pressed against the chuck 50 (as will be described in more detail below) contact between the outer surfaces of the first electrode 22 and the metal film layer 54 bring the partially reflective coating 60 into the predetermined alignment with the fundamental cavity modes of each of the VCSELs 12 of the wafer 10.

Figure 7:
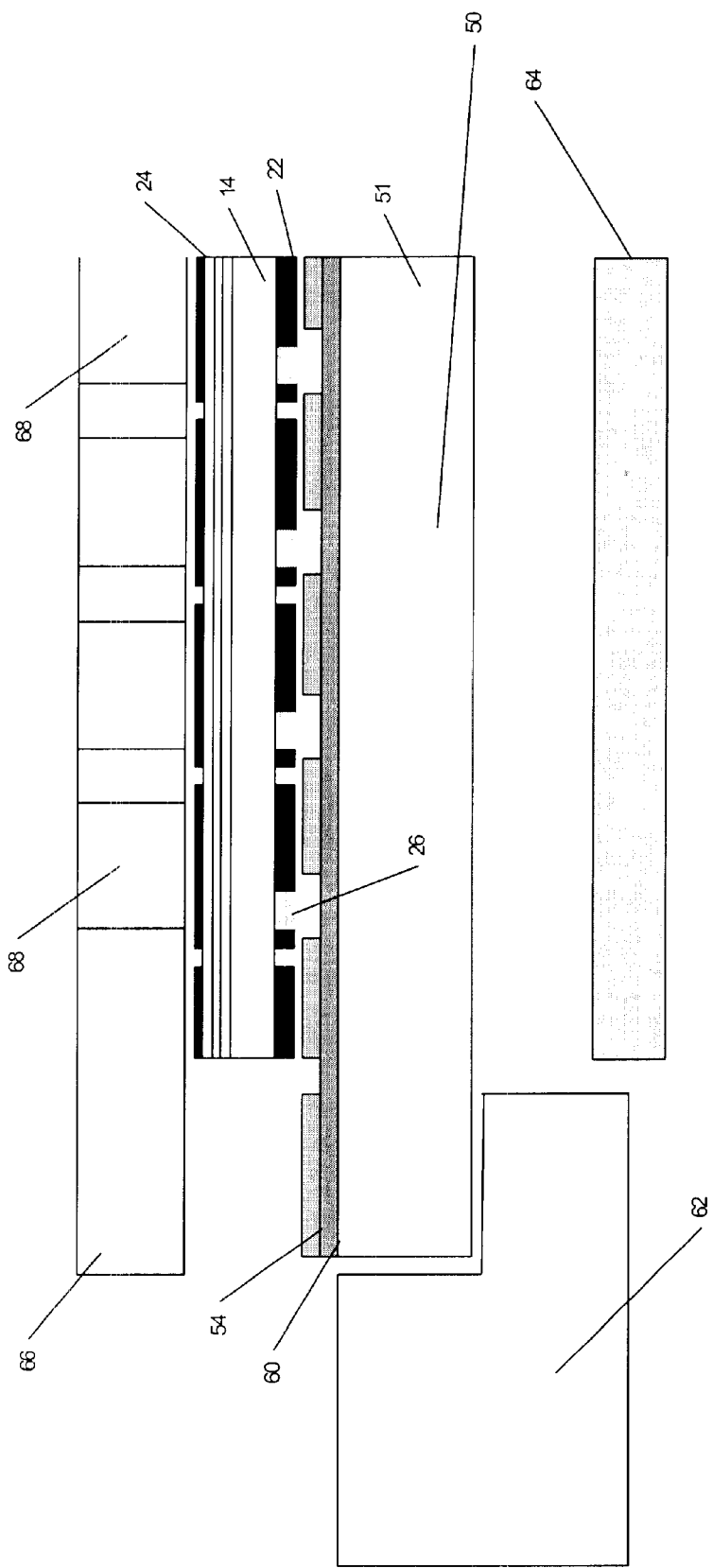
FIG. 7 shows an enlarged side view of a portion of for wafer-level testing of an apparatus for wafer-level testing of semiconductor lasers according to a second embodiment of the invention.
Figure 8:
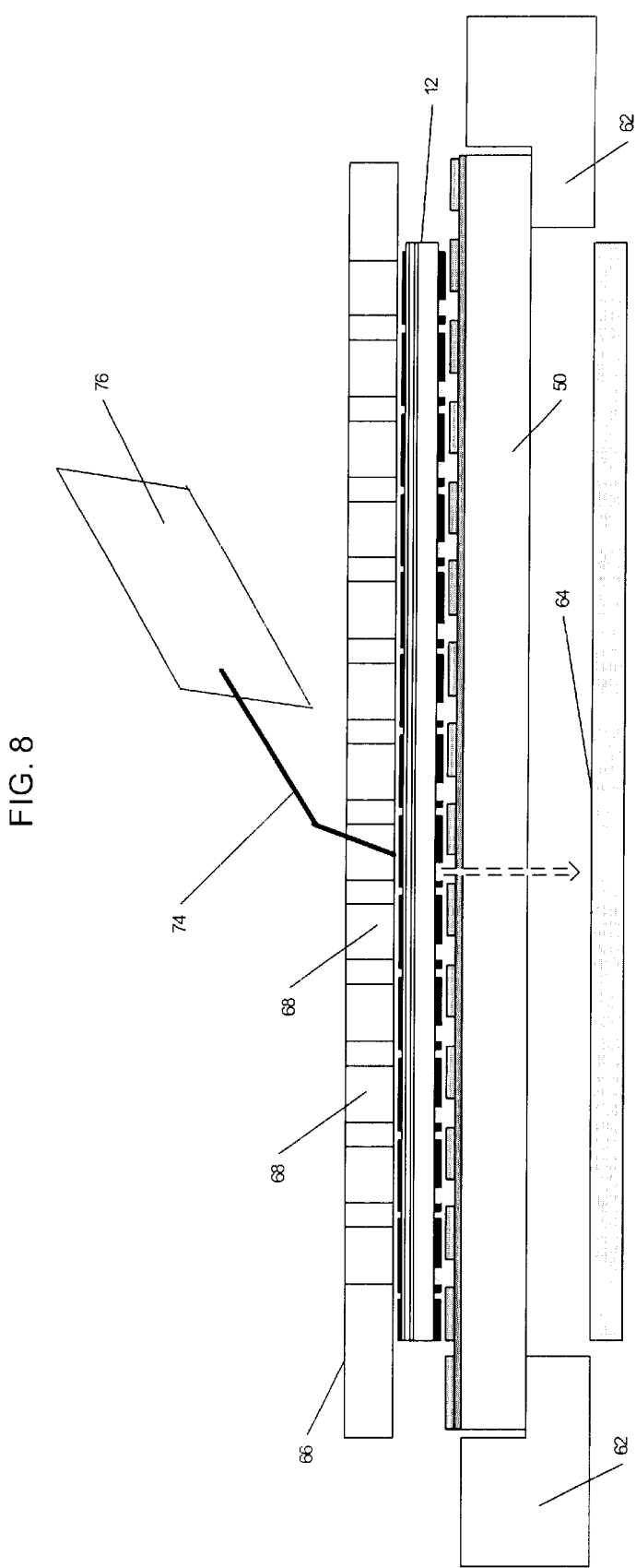
FIG. 8 shows a side view of the apparatus of FIG. 7.

Furthermore, as shown in FIGS. 7 and 8, when the wafer 10 is in the testing configuration with the outer surface of the first electrode 22 pressed against the outer surface of the metal film layer 54, a light detector 64 is positioned on a side of the chuck 50 opposite the side on which the metal film layer 54 is formed. In addition, a plate 66 (e.g., a metal plate coated with an insulator) including a plurality of access holes 68 extending therethrough is pressed against an outer surface of the second electrode 24 aligned so that a portion of the second electrode 24 corresponding to one of the VCSELs 12 is exposed through a respective one of the access holes 68. A thin layer 70 of insulating material which may, for example, be polyimide or sputtered silicon-nitride, is formed on the side of the plate 66 which will contact the second electrode 24 of the VCSELs 12. The access holes 68 may be formed in the plate 66 by, for example, etching or cutting by wire EDM (i.e. a wire electrode with a spark gap for eroding material).

Semiconductor wafers thinned to 50–100$\mu$ are also often not suitably flat to achieve suitable electrical contact between the metal film layer 54 and the first electrodes 24 of each of the VCSELs 12. The plate 66, when pressed against the wafer 10 flattens the wafer 10 to ensure contact between each of the VCSELs 12 and the metal film layer 54.

The chuck 50 is mounted to a support arm (not shown) which, by known mechanisms under computer control, sequentially positions the chuck 50 and the wafer 10 mounted thereon so that a desired one of the VCSELs 12 is aligned with an electrical probe 74 which is electrically coupled to a probe card 76 including known probe circuitry. When the desired one of VCSELs 12 is properly positioned, the electrical probe 74 is inserted into the corresponding one of the access holes 68 to electrically couple probe card 76 to the second electrode 24 of the desired one of the VCSELs 12 for testing. The electrical probe 74 is positioned so that, when the desired one of the VCSELs 12 is accessed by the probe 74, the optical aperture of the VCSEL 12 and the corresponding hole 56 are aligned with the light detector 64.

Figure 9:
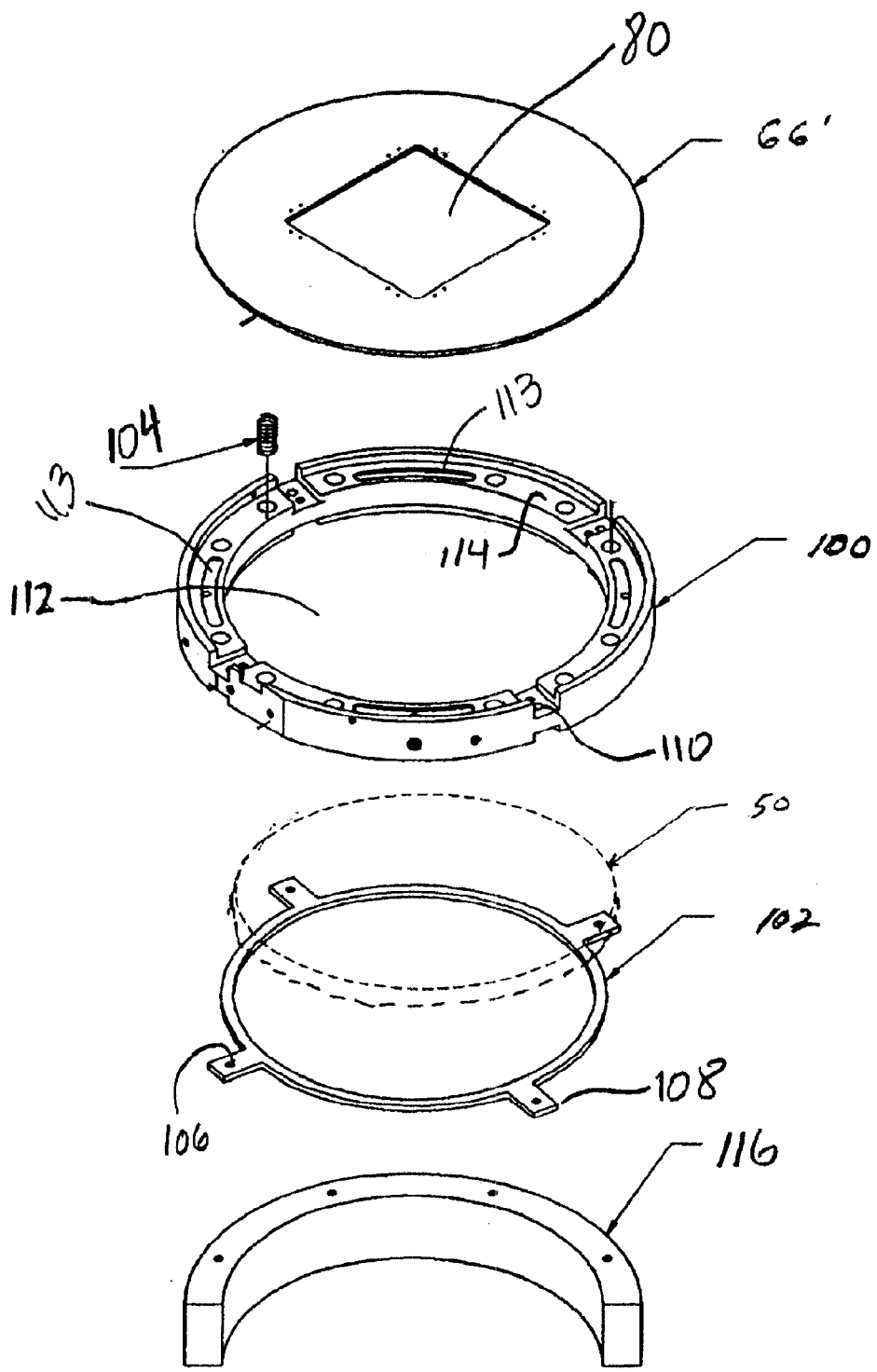
FIG. 9 shows a perspective view of an apparatus for securing a wafer with the various parts separated from one another.
Figure 10:
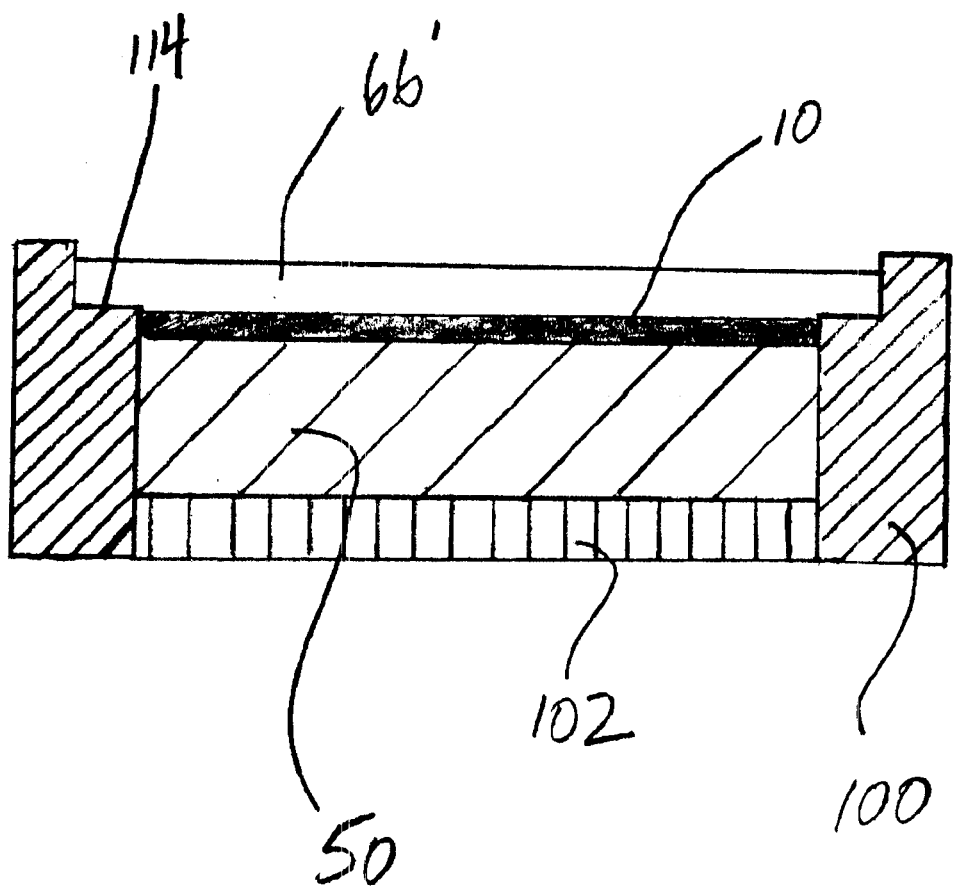
FIG. 10 shows a cross-sectional side view of the apparatus of FIG. 7 with a wafer received therein.

As shown in FIG. 9, the wafer 1 will be clamped between a plate 66' and the chuck 50 to flatten the wafer 10 and fix it in a desired position. In contrast to the plate 66 described above, the plate 66' shown in FIG. 6 includes one large central opening 80 via which all of the VCSELs 12 may be accessed by the probe 74. The opening 80 is shown as substantially square in shape, however, this opening may be arranged in any shape which corresponds to the location of the various VCSELs 12 on a wafer 10 to be tested. Alternatively, as described above a plate 66 including a plurality of access holes 68 may be used in conjunction with the apparatus and method of the invention.

The wafer 10 is placed on the surface of the chuck 50 and moved so that the optical apertures 26 are in alignment with the holes 56. For example, the chuck 50 may be sized so that it is larger than the wafer 10 to be tested. In this case, the holes 56 will extend out past the edge of the wafer 10 when the wafer 10 is received on the chuck 50. The array of the holes 56 which are visible at the edges of the chuck 50 may then be visually aligned with the channels 32 formed between the second electrodes 24 to ensure that the wafer 10 is properly aligned on the chuck 50 with respect to the holes 56. The chuck 50 is supported within a mounting ring 100 by an adjustable support 102 which is coupled to the mounting ring 100 via a plurality of screws (not shown) which pass through holes 106 formed in tabs 108 to enter corresponding holes 110 in mounting ring 100. The distance between the adjustable support 102 and the mounting ring 100 may be changed through adjustment of the screws 104.

The chuck 50 is sized to fit within the central hole 112 of the mounting ring 100 and the thickness of the mounting ring 100 and that of the chuck 50 are selected so that, when the adjustable support 102 is mounted to the mounting ring 100, the wafer 10 received on the chuck 50 is substantially flush with an inner surface 114 of the mounting ring 100. Then, the plate 66' is placed on a spring which holds the plate 66' above the wafer 10. The plate 66' is then maneuvered into the desired position relative to the wafer 10. The plate 66' may then be pressed down against the bias of spring and maintained in position contacting the wafer 10 by means of vacuum pressure applied through holes 113 extending through mounting ring 100. Thus, the plate 66' presses the wafer 10 flat and holds it in the desired position. Finally, a semi-circular spacer element 116 is positioned below the adjustable support 102 (and may be coupled thereto), to provide a predetermined spacing between the wafer 10 and a light detector 64 which will be position therebelow. Of course, depending on the desired distance, spacer elements 16 of various thicknesses may be employed. Furthermore, the spacer element 116 may also include tabs to maintain a constant orientation of the adjustable support 102 relative thereto.

In an embodiment for the testing of VCSEL devices that employ a mirror external to the laser cavity, providing the partially reflective coating 60 on a flat surface of the chuck 50 significantly reduces the time required for testing by eliminating the need to realign a mirror relative to each VCSEL 12 to be tested—i.e., each of the VCSELs 12 is aligned with the partially reflective coating 60 (which forms the extended cavity of each VCSEL 12) when the wafer 10 is properly positioned on the chuck 50.

The specific embodiments described above are merely illustrative and those skilled in the art will understand that there are many variations and modifications of this intention which may be made without departing from the scope of the invention which is to be limited only by the scope of the claims appended hereto.

What is claimed is:

1. A device for wafer level testing of semiconductor lasers, comprising:
    a chuck on which a wafer including lasers to be tested is received, wherein a first side of the wafer contacting the chuck includes optical apertures through which output beams of the lasers are emitted;
    an electrical probe accessing individual ones of the lasers on a second side of the wafer to stimulate emission from the accessed lasers; and
    a light detector receiving light from the accessed lasers after the light has passed through the chuck.

2. The device according to claim 1, wherein the chuck includes a substantially planar partially reflective layer returning a portion of the output beams to the lasers.

3. The device according to claim 1, wherein the chuck includes an electrically conductive layer on a surface thereof which contacts the first side of the wafer, the conductive layer having a plurality of holes formed therein which, when a wafer is received thereon in a desired position, are in alignment with the optical apertures of the lasers.

4. The device according to claim 1, wherein the chuck is mounted for movement relative to the electrical probe so that individual ones of the lasers may be sequentially brought into alignment with the electrical probe.

5. The device according to claim 3, the chuck including a substrate substantially transparent to the output beams of the lasers, and a partially reflective layer formed on the substrate.

6. The device according to claim 1, further including a substantially rigid plate which, when a wafer is received on the chuck, presses against the second side of the wafer to flatten the wafer against the chuck.

7. The device according to claim 6, wherein the plate includes a plurality of access holes extending therethrough so that, when the plate is pressed against a wafer, the access holes open to electrodes of corresponding ones of the lasers.

8. The device according to claim 6, wherein the plate is formed of metal with a layer of electrically insulative material on a surface thereof which contacts the second side of a wafer received on the chuck.

9. The device according to claim 1, wherein the probe is an electrical probe.

10. A method for wafer level testing of semiconductor lasers comprising the steps of:
    positioning a wafer having a plurality of lasers formed thereon on a chuck so that a surface of the wafer from which the lasers emit their respective output beams contacts the chuck, wherein the chuck includes a partially reflective layer which returns a portion of light incident thereon toward the wafer;
    electrically stimulating a desired one of the lasers by coupling a probe to a portion of a side of the wafer opposite the side contacting the chuck, the contacted portion corresponding to the desired one of the lasers; and
    detecting light emitted by the desired one of the lasers after the light has passed through the chuck.

11. The method according to claim 10, further comprising the step of moving the chuck relative to the probe to bring various ones of the plurality of lasers into alignment with the probe.

12. A method for wafer level testing of semiconductor lasers, comprising the steps of:
    positioning a wafer on a chuck with a first side of the wafer contacting the chuck including optical apertures through which output beams of the lasers included therein are emitted;
    electrically probing a desired one of the lasers on a second side of the wafer to stimulate emission from the desired one of the lasers; and
    detecting light from the desired one of the lasers after the light has passed through the chuck.

13. The method according to claim 12, wherein the chuck includes a partially reflective layer returning a portion of the output beams to the lasers.

14. The method according to claim 12, wherein the chuck includes an electrically conductive layer on a surface thereof which contacts the first side of the wafer, the conductive layer having a plurality of holes formed therein which, when a wafer is received thereon in a desired position, are in alignment with the optical apertures of the lasers.

15. The method according to claim 12, further comprising the step of moving the chuck relative to an electrical probe so that individual ones of the lasers may be sequentially brought into alignment with the electrical probe.

16. The method according to claim 14, wherein the chuck includes a substrate substantially transparent to the output beams of the lasers with a partially reflective layer formed therein.

17. The method according to claim 12, further comprising the step of clamping the wafer between the chuck and a substantially rigid plate to flatten the wafer against the chuck.

18. The method according to claim 17, wherein the substantially rigid plate includes a plurality of access holes and wherein the step of clamping the wafer between the chuck and the plate includes aligning the plate and the wafer so that the access holes open to electrodes of corresponding ones of the lasers.

19. The method according to claim 17, wherein the substantially rigid plate includes an access hole extending therethrough so that, when the plate is pressed against a wafer, the access hole opens to electrodes of a plurality of the lasers.

* * * * *